US 6,743,675 B2

(12) United States Patent
Ding (10) Patent No.: US 6,743,675 B2
(45) Date of Patent: Jun. 1, 2004

(54) FLOATING GATE MEMORY FABRICATION METHODS COMPRISING A FIELD DIELECTRIC ETCH WITH A HORIZONTAL ETCH COMPONENT

(75) Inventor: Yi Ding, Sunnyvale, CA (US)

(73) Assignee: Mosel Vitelic, Inc., Hsin-Chu (TW)

( * ) Notice: Subject to any disclaimer, the term of this patent is extended or adjusted under 35 U.S.C. 154(b) by 0 days.

(21) Appl. No.: 10/262,785

(22) Filed: Oct. 1, 2002

(65) Prior Publication Data

US 2004/0061165 A1 Apr. 1, 2004

(51) Int. Cl.$^7$ .......................................... H01L 21/336
(52) U.S. Cl. ...................... 438/257; 438/259; 438/266
(58) Field of Search ................... 438/257–267

(56) References Cited

U.S. PATENT DOCUMENTS

| | | | |
|---|---|---|---|
| 5,940,717 A | 8/1999 | Rengarajan et al. | 438/435 |
| 6,127,215 A | 10/2000 | Joachim et al. | 438/224 |
| 6,130,129 A | 10/2000 | Chen | 438/257 |
| 6,200,856 B1 | 3/2001 | Chen | 438/257 |
| 6,222,225 B1 | 4/2001 | Nakamura et al. | |
| 6,228,713 B1 | 5/2001 | Pradeep et al. | |
| 6,319,794 B1 | 11/2001 | Akatsu et al. | 438/424 |
| 6,323,085 B1 | 11/2001 | Sandhu et al. | |
| 6,355,524 B1 | 3/2002 | Tuan et al. | 438/257 |
| 6,376,877 B1 * | 4/2002 | Yu et al. | 257/317 |
| 6,417,047 B1 * | 7/2002 | Isobe | 438/258 |
| 6,448,606 B1 * | 9/2002 | Yu et al. | 257/315 |
| 6,518,618 B1 | 2/2003 | Fazio et al. | |

FOREIGN PATENT DOCUMENTS

JP 2000-174242 6/2000

OTHER PUBLICATIONS

U.S. patent application No. 10/266,378 entitled "Floating Gate Memory Structures And Fabrication Methods," filed on Oct. 7, 2002, Inventor: Chia–Shun Hsiao.
Patent Abstracts of Japan of JP 2000–174242.
Aritome, S. et al., "A 0.67um$^2$ Self–Aligned Shallow Trench Isolation Cell (SA–STI Cell) For 3V–only 256Mbit NAND EEPROMs," International Electron Devices meeting 1994, San Francisco, CA, Dec. 11–14, 1994, pp. 94–61–94–64.
Keeney, Stephen N., A 130nm Generation High Density Etox™ Flash Memory Technology, Intel, Corporation, Santa Clara, California, USA, 42 sheets.
Silicon, Flash and Other Non–Volatile Memory Technologies, Sep. 12, 2002, pp. 1–4.

* cited by examiner

Primary Examiner—Jack Chen
(74) Attorney, Agent, or Firm—Michael Shenker; MacPherson Kwok Chen & Heid LLP (57) ABSTRACT

A silicon nitride layer (120) is formed over a semiconductor substrate (104) and patterned to define isolation trenches (130). The trenches are filled with dielectric (210). The nitride layer is removed to expose sidewalls of the trench dielectric (210). The dielectric is etched to recess the sidewalls away from the active areas (132). Then a conductive layer (410) is deposited to form floating gates for nonvolatile memory cells. The recessed portions of the dielectric sidewalls allow the floating gates to be wider at the top. The gate coupling ratio is increased as a result. Other features are also provided.

21 Claims, 7 Drawing Sheets

FLOATING GATE MEMORY FABRICATION METHODS COMPRISING A FIELD DIELECTRIC ETCH WITH A HORIZONTAL ETCH COMPONENT

BACKGROUND OF THE INVENTION

The present invention relates to floating gate nonvolatile memories.

A floating gate nonvolatile memory cell stores information by storing an electrical charge on its floating gate. The floating gate is capacitively coupled to the control gate. In order to write the cell, a potential difference is created between the control gate and some other region, for example, the source, drain or channel region of the cell. The voltage on the control gate is capacitively coupled to the floating gate, so a potential difference appears between the floating gate and the source, drain or channel region. This potential difference is used to change the charge on the floating gate.

Figure 3:
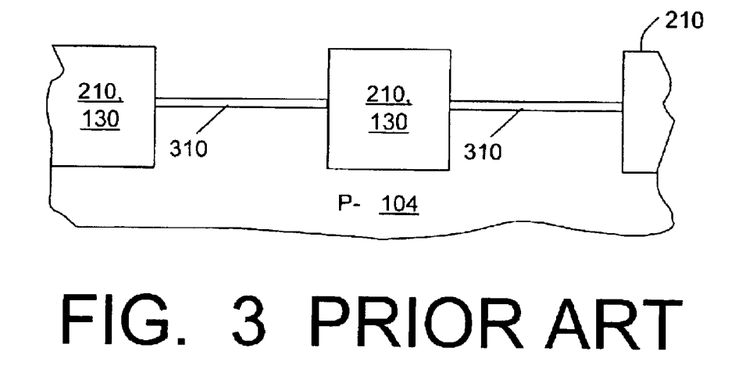
Figure 4:
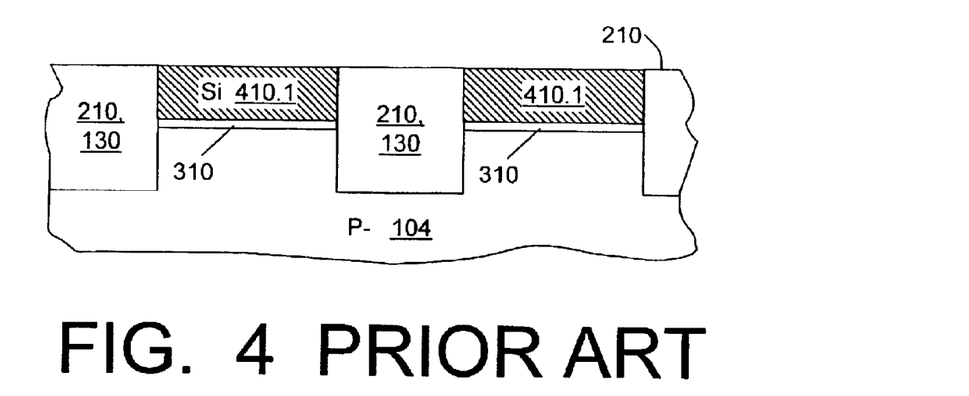

In order to reduce the potential difference that has to be provided between the control gate and the source, drain or channel region, it is desirable to increase the capacitance between the control and floating gates relative to the capacitance between the floating gate and the source, drain or channel region. More particularly, it is desirable to increase the "gate coupling ratio" GCR defined as CCG/(CCG+CSDC) where CCG is the capacitance between the control and floating gates and CSDC is the capacitance between the floating gate and the source, drain or channel region. One method for increasing this ratio is to form spacers on the floating gate. See U.S. Pat. No. 6,200,856 issued Mar. 13, 2001 to Chen, entitled "Method of Fabricating Self-Aligned Stacked Gate Flash Memory Cell", incorporated herein by reference. In that patent, the memory is fabricated as follows. Silicon substrate 104 (FIG. 1) is oxidized to form a pad oxide layer 110. Silicon nitride 120 is formed on oxide 110 and patterned to define isolation trenches 130. Oxide 110 and substrate 104 are etched, and the trenches are formed. Dielectric 210 (FIG. 2), for example, borophosphosilicate glass, is deposited over the structure to fill the trenches, and is planarized by chemical mechanical polishing (CMP). The top surface of dielectric 210 becomes even with the top surface of nitride 120. Then nitride 120 is removed (FIG. 3). Oxide 110 is also removed, and gate oxide 310 is thermally grown on substrate 104 between the isolation trenches. Doped polysilicon layer 410.1 (FIG. 4) is deposited over the structure to fill the recessed areas between the isolation regions 210. Layer 410.1 is polished by chemical mechanical polishing so that the top surface of layer 410.1 becomes even with the top surface of dielectric 210.

Figure 5:
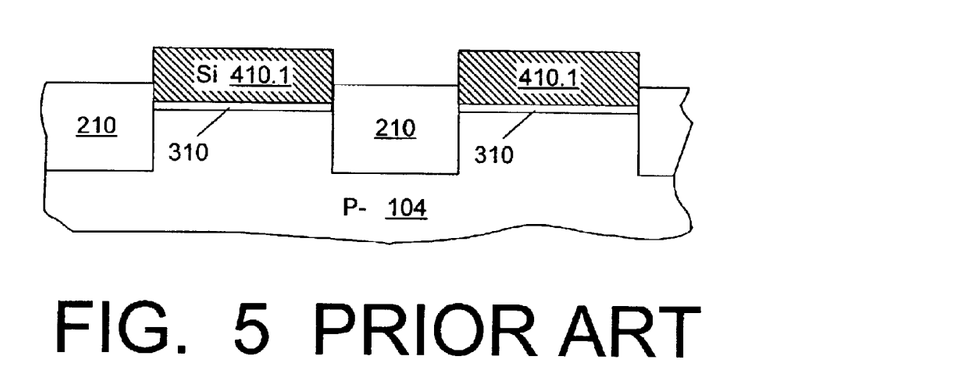
Figure 6:
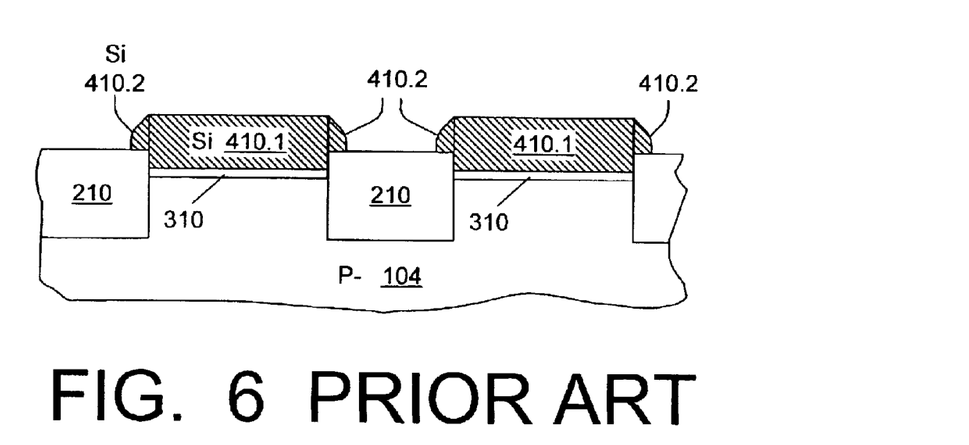

Dielectric 210 is etched to partially expose the "edges" of polysilicon layer 410.1 (FIG. 5). Then doped polysilicon 410.2 (FIG. 6) is deposited and etched anisotropically to form spacers on the edges of polysilicon 410.1. Layers 410.1, 410.2 provide the floating gates.

Figure 7:
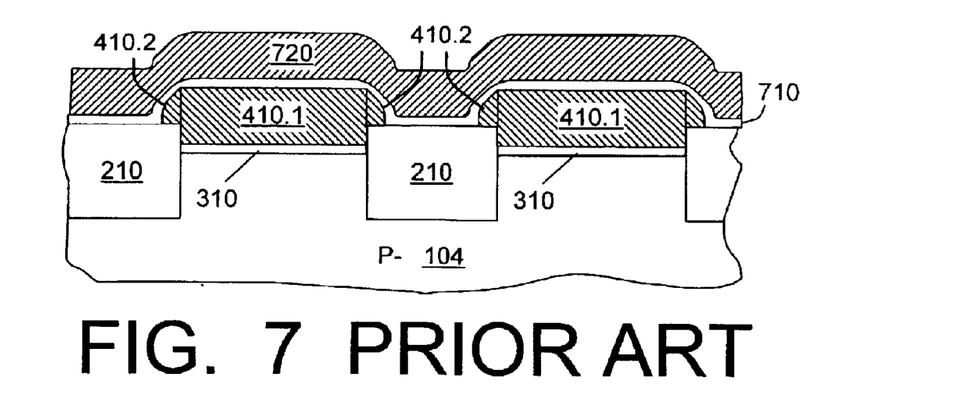

As shown in FIG. 7, dielectric 710 (oxide/nitride/oxide) is formed on polysilicon 410.1, 410.2. Doped polysilicon layer 720 is deposited on dielectric 710 and patterned to provide the control gates.

Spacers 410.2 increase the capacitance between the floating and control gates by more than the capacitance between the floating gates and substrate 104, so the gate coupling ratio is increased.

SUMMARY

This section is a brief summary of some features of the invention. The invention is defined by the appended claims which are incorporated into this section by reference.

In some embodiments of the present invention, before the floating gate polysilicon is deposited, the trench dielectric 210 is subjected to an etch which includes a horizontal etch component. For example, a wet etch can be used. Consequently, the sidewalls of dielectric 210 become recessed away from the active areas (see FIG. 13 for example). Therefore, the floating gate polysilicon 410 is wider at the top (FIG. 14). The gate coupling ratio is therefore increased.

The invention is not limited to polysilicon, silicon oxide, or other particular materials, or to particular dimensions, memory structures, or fabrication processes. Other features are described below.

DESCRIPTION OF SOME EMBODIMENTS

This section describes some embodiments to illustrate the invention. The invention is not limited to these embodiments. The materials, conductivity types, dimensions, and other details are given for illustration and are not limiting.

Figure 8:
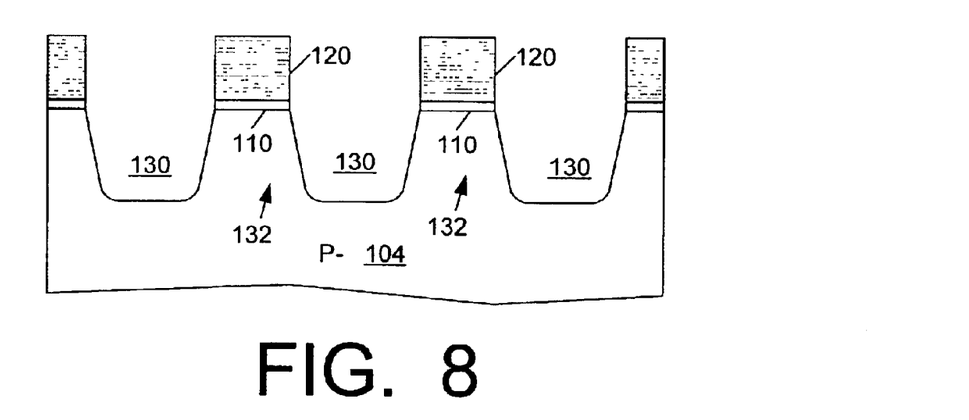
FIGS. 8–16, 17A, 17B show cross sections of nonvolatile memory structures in the process of fabrication according to the present invention.
Figure 9:
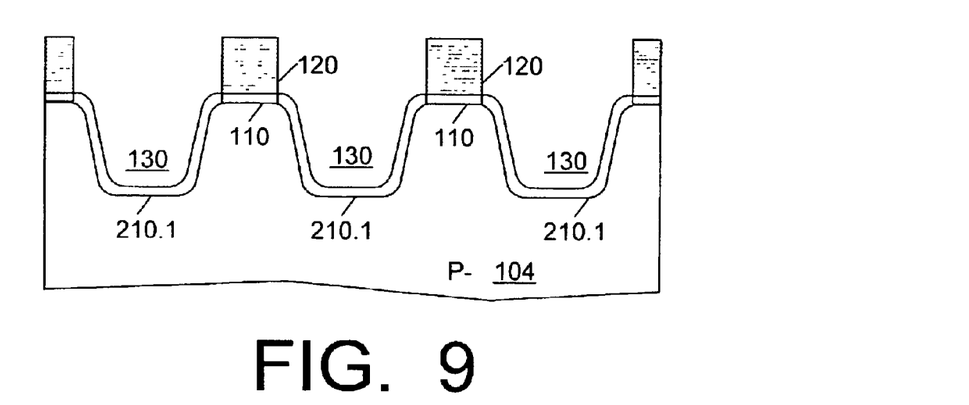
Figure 10:
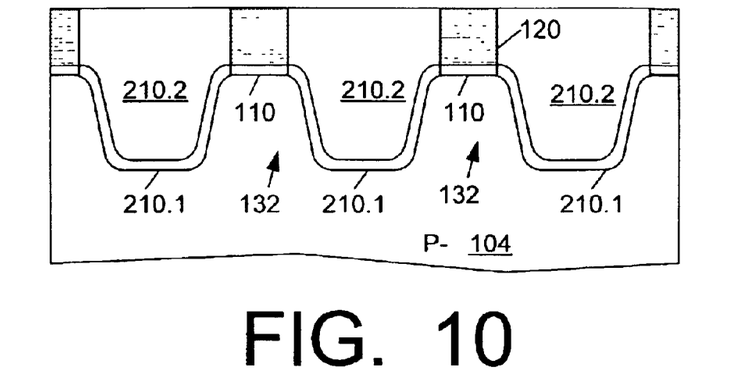

In some embodiments, the memory array fabrication starts with substrate isolation. The pertinent fabrication processes can be identical or similar to the processes of FIGS. 1–2. FIGS. 8–10 illustrate one variation commonly practiced in DRAM technology. A doped region of type P- is formed in monocrystalline semiconductor substrate 104 as described, for example, in U.S. Pat. No. 6,355,524 issued Mar. 12, 2002 to H. T. Tuan et al. and incorporated herein by reference. This region is isolated by P-N junctions (not shown).

Figure 1:
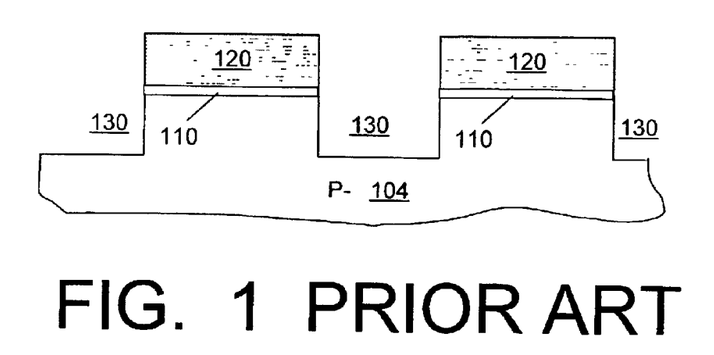
FIGS. 1–7 show cross sections of prior art nonvolatile memory structures in the process of fabrication.
Figure 2:
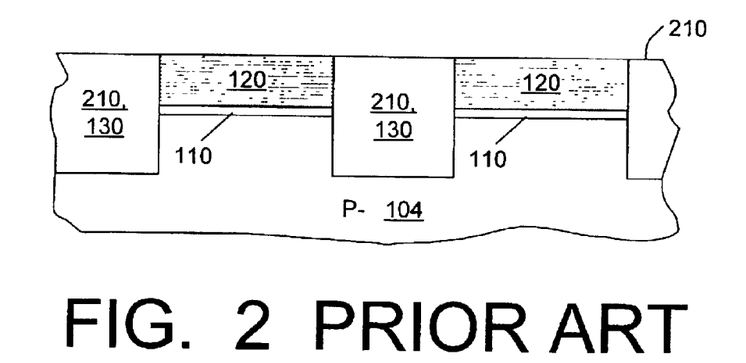

Field dielectric regions are fabricated by shallow trench isolation ("STI") technology using a process like that of FIGS. 1–2. More particularly, silicon dioxide 110 (pad oxide) is formed on substrate 104 by thermal oxidation or some other technique (FIG. 8). Silicon nitride 120 is deposited on oxide 110. Nitride 120 is patterned photolithographically, using a photoresist mask (not shown), to define substrate isolation trenches 130. Oxide 110 and substrate 104 are etched through the openings in nitride 120. Trenches 130 ("STI trenches") are formed in the substrate as a result. An exemplary depth of trenches 130 is 0.25 μm measured from the top surface of the substrate 104. Other depths are possible. Trenches 130 will be filled with dielectric to provide isolation between active areas 132 of substrate 104.

In FIG. 8, the trenches have sloping sidewalls, and the trenches are wider at the top than at the bottom. In some embodiments, the trenches have vertical sidewalls, or the trenches are wider at the bottom. The invention is not limited by any shape of the trenches.

Nitride 120 is subjected to a wet etch to recess the vertical edges of the nitride layer away from trenches 130. See FIG. 9. This step reduces the aspect ratio of the holes that will be filled with dielectric 210 (these holes are formed by the openings in nitride 120 and oxide 10 and by the trenches 130). The lower aspect ratio facilitates filling these holes.

A thin layer 210.1 of silicon dioxide is thermally grown on the exposed silicon surfaces to round the edges of trenches 130. Silicon dioxide 210.2 (FIG. 10) is deposited by a high density plasma process. Oxide 210.2 fills the trenches and initially covers the nitride 120. Oxide 210.2 is polished by a CMP process that stops on nitride 120. A planar top surface is provided.

In the subsequent figures, the layers 210.1, 210.2 are shown as a single layer 210. This dielectric 210 will be referred to as STI dielectric or, more generally, field dielectric.

Figure 11:
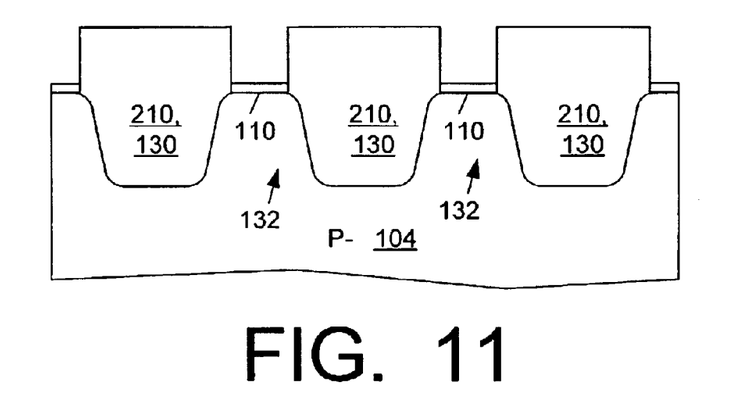

Nitride 120 is removed selectively to oxide 210 (FIG. 11). This can be done by a wet etch (e.g. with phosphoric acid).

Figure 12:
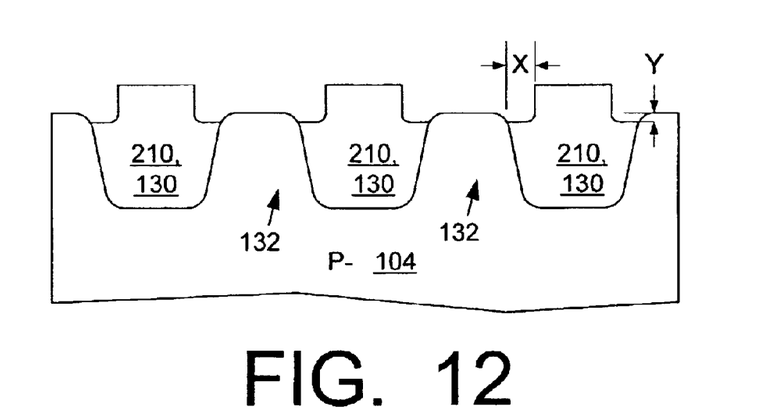

Then oxide 210 is etched (FIG. 12). This etch includes a horizontal component that causes the sidewalls of dielectric 210 to be laterally recessed away from active areas 132. This etch can also remove the oxide 110. The etch can be an isotropic wet etch selective to silicon nitride. A buffered oxide etch or a dilute HF (DHF) etch is used in some embodiments.

In one embodiment, the top surface of dielectric 210 is laterally offset from the top surface of active areas 132 by an amount X=300 Å at the end of this etch. Some of dielectric 210 may be etched out of the trenches 130 near the active areas 132, and the sidewalls of trenches 130 may become exposed at the top, but this is not necessary. In some embodiments, the trench sidewalls are exposed to a depth Y=300 Å. These dimensions are exemplary and not limiting.

Figure 13:
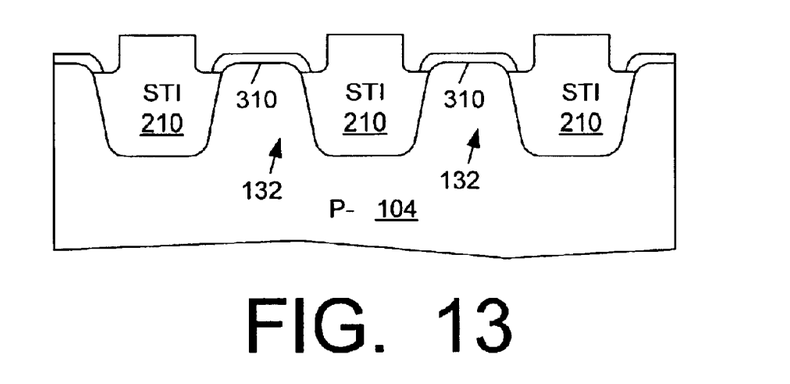
Figure 14:
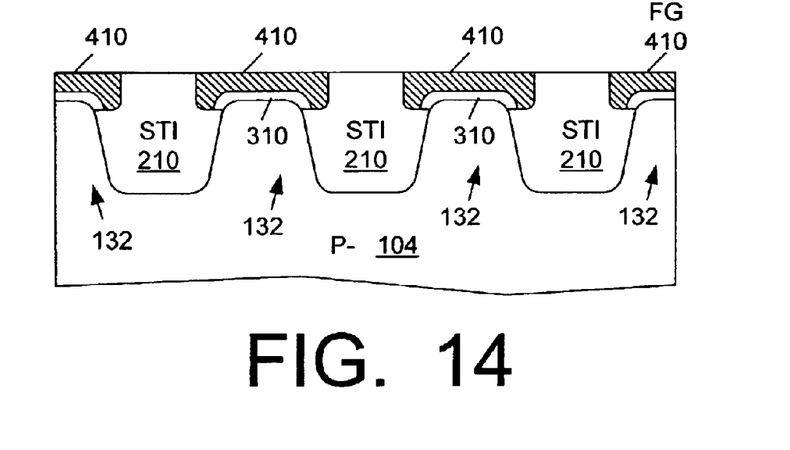

As shown in FIG. 13, silicon dioxide 310 (tunnel oxide) is thermally grown on the exposed areas of substrate 104. An exemplary thickness of oxide 310 is 95 Å.

As shown in FIG. 14, conductive polysilicon layer 410 (floating gate polysilicon) is formed over the structure. Polysilicon 410 fills the areas between oxide regions 210 and initially covers the oxide 210. Polysilicon 410 is polished by a CMP process that stops on oxide 210. The structure has a planar top surface at this step, with the top surface of polysilicon 410 being even with the top surface of oxide 210. Polysilicon 410 can be doped in-situ or after the deposition. Polysilicon 410 projects over the isolation trenches 130.

Figure 15:
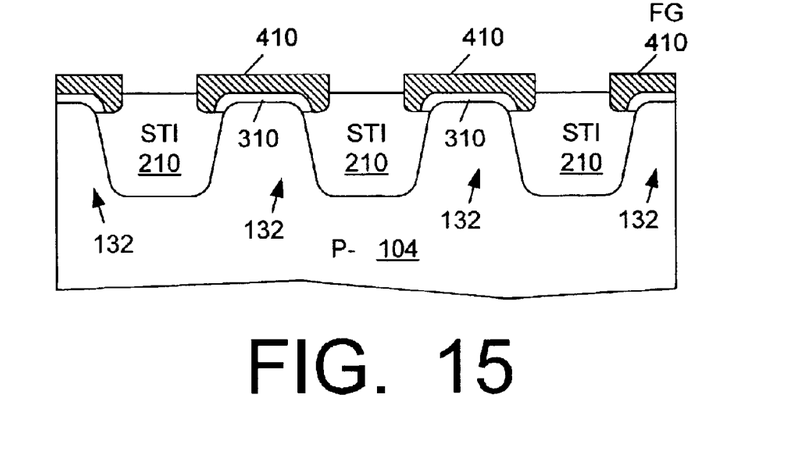

An optional etch of oxide 210 lowers the top surface of oxide 210 to a level below the top surface of polysilicon 410. See FIG. 15. A timed wet etch can be used for this purpose.

Figure 16:
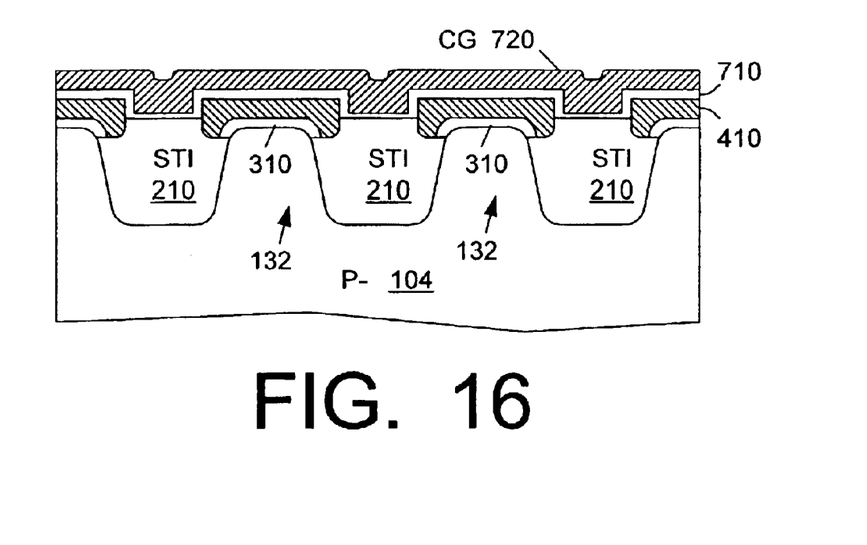

Then dielectric 710 (FIG. 16) is formed over the structure. In one embodiment, dielectric 710 is ONO (oxide/nitride/oxide), i.e. a combination of a silicon dioxide layer, a silicon nitride layer, and another silicon dioxide layer. Control gate polysilicon 720 is deposited on dielectric 710 and patterned. Polysilicon 720 is made conductive by doping. Layers 710, 410 can be patterned after the patterning of layer 720 as appropriate. Due to the etch of oxide 210 described above in connection with FIG. 15, the polysilicon 720 extends down along the sidewalls of polysilicon layer 410. The capacitive coupling between the layers 410, 720 is consequently increased. Note S. Aritome et al., "A 0.67 um² SELF-ALIGNED SHALLOW TRENCH ISOLATION CELL (SA-STI CELL) FOR 3V-only 256 Mbit NAND EEPROMs", IEDM 1994, pages 61–64, incorporated herein by reference. See also the aforementioned U.S. Pat. No. 6,355,524.

Figure 17A:
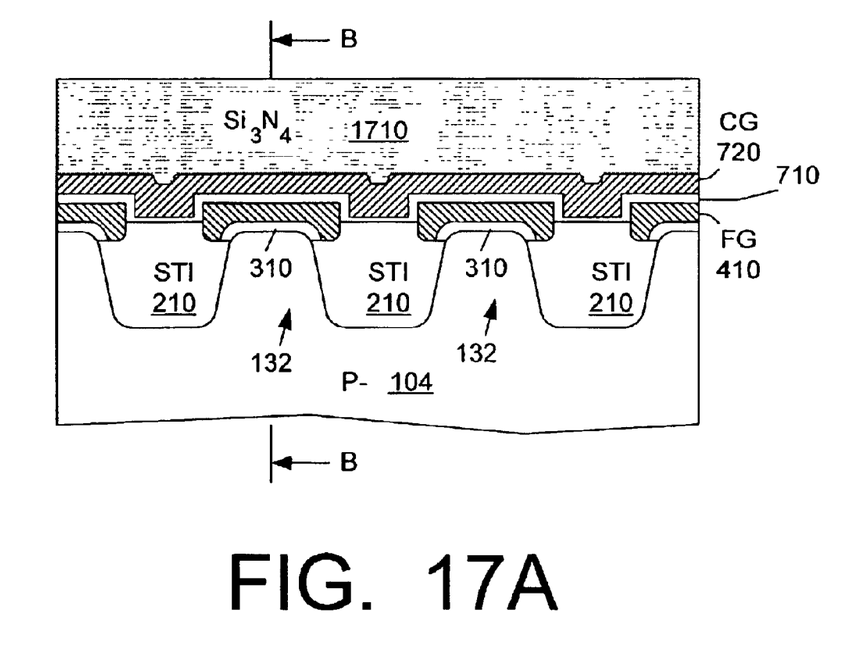
Figure 17B:
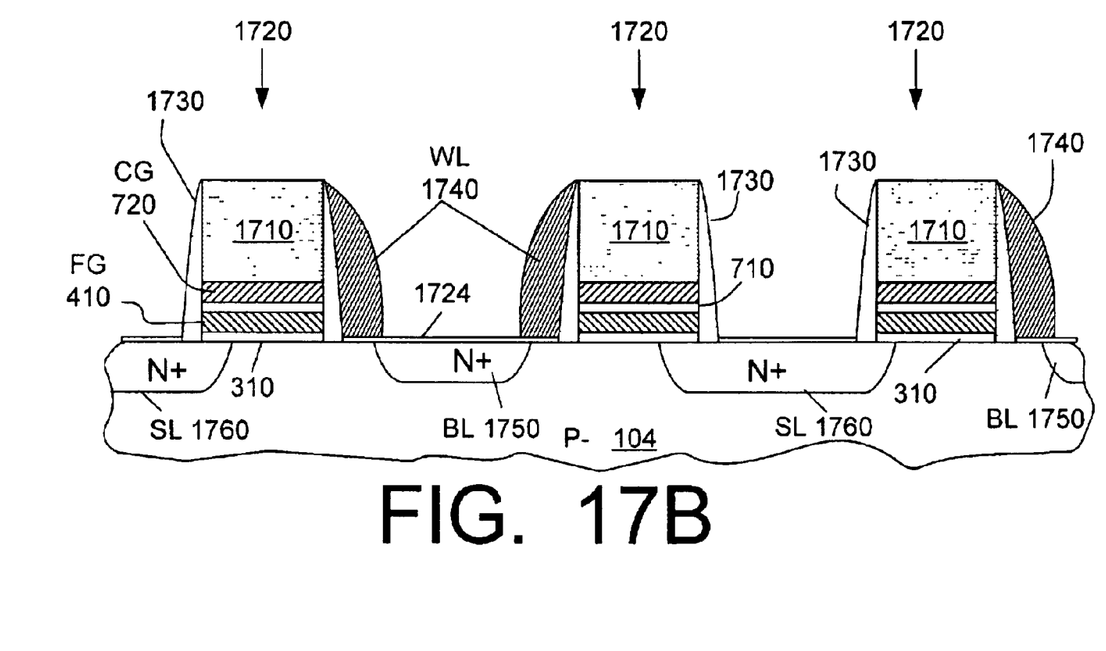

A wide range of floating gate memories can be fabricated using the teachings of the present invention. Stacked gate memories, split gate memories, and other types of memories, including flash and non-flash EEPROMs, can be fabricated. An example split gate flash memory array is illustrated in FIGS. 17A, 17B. This memory is a modification of the memory disclosed in the aforementioned U.S. Pat. No. 6,355,524. FIG. 17A shows a cross section of the array in the same cross sectional plane as FIG. 16. FIG. 17B shows a cross section in the plane that is marked B—B in FIG. 17A. This plane passes along a column of the array between the trenches 130.

The memory fabrication proceeds as in FIGS. 8–16, and then as in U.S. Pat. No. 6,355,524. Briefly, a silicon nitride layer 1710 is deposited on polysilicon 720. Layers 1710, 720, 710, 410 are etched to form a number of stacks 1720 (FIG. 17B). Each stack 1720 extends along one row of the array. Polysilicon 720 provides a control gate line for each row. Polysilicon 410 provides the floating gates. The individual floating gates in each row are separated from each other due to the CMP of polysilicon 410 described above in connection with FIG. 14.

Dielectric spacers 1730 (FIG. 17B) are formed on the sidewalls of each stack 1720 from a combination of silicon dioxide and silicon nitride layers. Gate dielectric 1724 is formed on substrate 104. A polysilicon layer 1740 is deposited and etched anisotropically to form conductive spacers over the sidewalls of each stack. Layer 1740 is removed from one sidewall of each stack. The remaining spacers 1740 provide wordlines for the corresponding memory rows.

N+ doped source/drain regions 1750, 1760 are formed in substrate 104. Regions 1750 ("bitline regions") are adjacent to the wordlines 1740. Regions 1750 are connected to the bitlines (not shown). Regions 1760 ("source line regions") of each row are merged together into a continuous source line. Each row shares its source line with an adjacent row.

The invention is not limited to the embodiments described above. For example, pad oxide 110 (FIG. 8) can be omitted. The X dimension (FIG. 12) can be zero. X can also be negative, i.e. the oxide 210 can encroach on the active areas 132. The Y dimension can also be zero or negative. The invention is not limited to any particular materials or memory structures. The invention is not limited to STI technology. Field dielectric regions 210 can be formed by another technology, known or to be invented. The invention is defined by the appended claims.

What is claimed is:

1. A manufacturing method comprising:

forming at least one field dielectric region to insulate active areas of a semiconductor substrate from each other, wherein the top surface of the field dielectric region is above the top surface of the semiconductor substrate;

subjecting the field dielectric region to an etch that includes a horizontal component, to recess at least a portion of at least one sidewall of the field dielectric region away from an active area adjacent to the sidewall; and forming a first conductive layer over the substrate, the first conductive layer having a sidewall adjoining the recessed portion of the sidewall of the field dielectric region, the first conductive layer providing at least a portion of a floating gate for one or more nonvolatile memory cells;

wherein the first conductive layer is formed with its top surface being even with the top surface of the field dielectric region; and the method further comprises, after forming the first conductive layer, etching the field dielectric region to lower the top surface of the field dielectric region to a level below the top surface of the first conductive layer.

2. The method of claim 1 wherein forming the field dielectric region comprises:
    forming a first layer over the semiconductor substrate;
    forming one or more openings in the first layer;
    etching the substrate through the one or more openings to form one or more trenches;
    filling the one or more trenches with a dielectric which provides one or more field dielectric regions including said at least one field dielectric region; and
    removing at least a portion of the first layer to expose one or more sidewalls of the field dielectric regions including the sidewall of said at least one field dielectric region.

3. The method of claim 1 further comprising, before forming the first conductive layer, forming a dielectric layer over the semiconductor substrate to insulate the floating gate from one of the active areas which underlies the floating gate and which is an active area of one of the one or more nonvolatile memory cells.

4. The method of claim 1 further comprising:
    forming a dielectric layer on the first conductive layer; and
    forming a second conductive layer on the dielectric layer formed on the first conductive layer, the second conductive layer providing a control gate for each nonvolatile memory cell.

5. The method of claim 1 wherein the recessed portion of the sidewall of the field dielectric region allows the first conductive layer to project laterally beyond the active area.

6. The method of claim 1 wherein the field dielectric region comprises a first portion, wherein the top surface of the first portion is not higher than the top surface of the semiconductor substrate, and the first conductive layer has a projecting portion that projects laterally over the first portion of the field dielectric region, wherein the top surface of the projecting portion is not higher than the top surface of the field dielectric region.

7. The method of claim 1 wherein after the etch, said portion of the sidewall of the field dielectric region is a top portion of the sidewall of the field dielectric region.

8. The method of claim 1 wherein after the etch, the top of said portion of the sidewall of the field dielectric region is laterally offset from the top surface of the adjacent active area by 300 Å.

9. The method of claim 1 wherein the sidewall of the field dielectric region is above the top surface of the semiconductor substrate after the etch.

10. The method of claim 1 wherein the first conductive layer is formed after the etch of the field dielectric region, and the first conductive layer provides the entire floating gate for the nonvolatile memory cell.

11. A manufacturing method comprising:
    forming a first layer over a semiconductor substrate;
    forming one or more openings in the first layer;
    etching the substrate through the one or more openings to form one or more trenches;
    forming a first dielectric layer in the trenches, the first dielectric layer extending above the substrate;
    removing at least a portion of the first layer to expose a sidewall of the first dielectric layer;
    etching the sidewall of the first dielectric layer to laterally recess at least a portion of the sidewall; and
    forming a first conductive layer over the substrate, the first conductive layer having a sidewall adjoining the sidewall of the first dielectric layer, the first conductive layer providing at least portions of one or more floating gates for one or more nonvolatile memory cells;
    wherein the first conductive layer is formed with its top surface being even with the top surface of the first dielectric layer; and
    the method further comprises, after forming the first conductive layer, etching the first dielectric layer to lower the top surface of the first dielectric layer to a level below the top surface of the first conductive layer.

12. The method of claim 11 wherein the first layer comprises silicon nitride and the sidewall of the first dielectric layer is made of silicon oxide.

13. The method of claim 12 wherein the first layer comprises a silicon oxide layer and a silicon nitride layer formed on the silicon oxide layer.

14. The method of claim 11 further comprising, before forming the first conductive layer, forming a dielectric layer over the semiconductor substrate to insulate the one or more floating gates from substrate areas located between the trenches, the substrate areas between the trenches comprising active areas of the one or more nonvolatile memory cells.

15. The method of claim 11 further comprising:
    forming a dielectric layer on the first conductive layer; and
    forming a second conductive layer on the dielectric layer formed on the first conductive layer, the second conductive layer providing a control gate for each nonvolatile memory cell.

16. The method of claim 11 wherein the laterally recessed portion of the sidewall of the first dielectric layer allows the first conductive layer to project laterally over the trenches.

17. The method of claim 11 wherein the first conductive layer has a projecting portion that projects laterally over the trenches, wherein the top surface of the projecting portion is not higher than the top surface of the first dielectric layer.

18. The method of claim 11 wherein after the etching, said portion of the sidewall of the first dielectric layer is a top portion of the sidewall of the field dielectric layer.

19. The method of claim 11 wherein the etching operation laterally offsets said portion of said sidewall of the first dielectric layer by at least 300 Å.

20. The method of claim 11 wherein the sidewall of the first dielectric layer is above the top surface of the semiconductor substrate after the etching.

21. The method of claim 11 wherein the first conductive layer is formed after the etching of the sidewall of the first dielectric layer, and the first conductive layer provides at least one entire floating gate for at least one nonvolatile memory cell.

* * * * *